United States Patent
Kner et al.

(10) Patent No.: US 6,181,717 B1
(45) Date of Patent: Jan. 30, 2001

(54) TUNABLE SEMICONDUCTOR LASER SYSTEM

(75) Inventors: Peter Kner, Oakland; Gabriel Li, Emeryville; Philip Worland; Rang-Chen Yu, both of San Jose; Wupen Yuen, Stanford, all of CA (US)

(73) Assignee: Bandwidth 9, Fremont, CA (US)

( * ) Notice: Under 35 U.S.C. 154(b), the term of this patent shall be extended for 0 days.

(21) Appl. No.: 09/326,010

(22) Filed: Jun. 4, 1999

(51) Int. Cl.[7] .................................................... H01S 3/10
(52) U.S. Cl. ................... 372/20; 372/45; 372/50; 372/34
(58) Field of Search ................... 372/20, 45, 50, 372/34

(56) References Cited

U.S. PATENT DOCUMENTS 5,301,201 * 4/1994 Dutta et al. ........................... 372/20

OTHER PUBLICATIONS

Wittke et al;"Stabilization of CW Injection Lasers";RCA Technical Notes,TN No. 1005 Apr. 9, 1975;Sheets 1–3.*

* cited by examiner

*Primary Examiner*—Leon Scott, Jr.
(74) *Attorney, Agent, or Firm*—Wilson Sonsini Goodrich & Rosati

(57) ABSTRACT

A tunable semiconductor laser system includes a laser with a semiconductor active region positioned between upper and lower confining regions of opposite type semiconductor material. First and second reflective members are positioned at opposing edges of the active and confining regions. A wavelength tuning member and a temperature sensor are coupled to the laser. A control loop is coupled to the temperature sensor and the tuning member. In response to a detected change in temperature the control loop sends an adjustment signal to the tuning member and the tuning member adjusts a voltage or current supplied to the laser to provide a controlled output beam of selected wavelength.

42 Claims, 19 Drawing Sheets

TUNABLE SEMICONDUCTOR LASER SYSTEM

BACKGROUND OF THE INVENTION

1. Field of the Invention

This invention relates generally to semiconductor lasers, and more particularly to a semiconductor laser diode system with a control loop that provides a controlled output beam of selected wavelength in response to a changes in temperature of the diode or changes in output beam wavelength.

2. Description of Related Art

There are stringent requirements on the stability of the output wavelength and the output power of semiconductor laser units used for optical communication, and specifically for dense wave division multiplexing (DWDM). Typically, the lasers used for these applications are distributed feedback (DFB) semiconductor lasers. At fixed driving current, the output power and wavelength of these devices varies strongly with temperature. Typically the wavelength change is 0.6 Å/°C. Over an operating range of 0 to 75 degrees Celsius, this wavelength change is 4.5 nm. In DWDM systems the channel spacing is 0.8 nm or 0.4 nm so this wavelength variation is unacceptable. In addition, aging of the laser will also cause a change in wavelength. To overcome this problem DFB lasers are packaged with a temperature sensor and a cooler which operate in a closed loop to maintain the laser at a fixed temperature. At a fixed temperature the laser wavelength variation is minimized. Thermal control systems used with laser diodes have included the combination of a photodiode, thermoelectric cooler and thermistor. The photodiode receives a portion of the output of the diode laser. The output from the laser diode is stabilized by a feedback drive circuit and a reference adjust variable resistor. A temperature feedback circuit uses a thermistor and the reference adjust resistor to provide feedback stabilization of the laser diode temperature.

U.S. Pat. No. 5,602,860 discloses a cooling system for a laser diode that includes a temperature sensitive switch. When a temperature exceeds a given temperature the switch is open. Coupled to the switch is a thermoelectric cooler that cools the laser diode.

To provide more precise control of the wavelength, the wavelength can be monitored. U.S. Pat. No. 5,867,513 discloses a semiconductor laser unit in which the temperature is controlled in a closed loop which monitors the output wavelength of the laser.

Thermoelectric coolers generally require larger, more expensive power supplies than would otherwise be used. The use of thermoelectric coolers has proven to waste a significant amount of power from the power source. In one device, one or more voltage regulators are used to regulate the power supplied to a thermoelectric cooler. The power used by the voltage regulator is wasted. In addition the thermoelectric cooler itself adds to the cost of manufacturing the laser. U.S. Pat. No. 5,387,974 discloses one embodiment of a temperature insensitive wavelength meter and wavelength compensation for a KrF excimer laser as a method of avoiding the use of costly temperature control. Excimer lasers produce light in the UV wavelength range and are not appropriate for communications applications.

There is a need for a passively cooled wavelength stabilized laser system suitable for use in WDM communication applications and systems.

SUMMARY OF THE INVENTION

Accordingly, an object of the present invention is to provide a laser system.

Another object of the present invention is to provide a wavelength stabilized laser system.

A further object of the present invention is to provide a passively cooled wavelength stabilized laser system.

Yet another object of the present invention is to provide a passively cooled wavelength stabilized laser system useful in WDM communications.

These and other objects of the invention are achieved in a tunable semiconductor laser system. Included is a laser with a semiconductor active region positioned between upper and lower confining regions of opposite type semiconductor material. First and second reflective members are positioned at opposing edges of the active and confirming regions. A wavelength tuning member and a temperature sensor are coupled to the laser. A control loop is coupled to the temperature sensor and the tuning member. In response to a detected change in temperature the control loop sends an adjustment signal to the tuning member and the tuning member adjusts a voltage or current supplied to the laser to provide a controlled output beam of selected wavelength.

In another embodiment, a tunable semiconductor laser system includes a laser with an electrically responsive substrate. A support block is positioned on the electrically responsive substrate. Also included are top and bottom reflectors. A first cantilever structure includes a base section that rests on the support block. A deformable section extends above the electrically responsive substrate, creating an air gap between the deformable section and the electrically responsive substrate. An active head is positioned at a predetermined location on the deformable section and includes at least a portion of the top reflecting member. A wavelength measurement member is positioned to receive at least a portion of the output beam of the laser. A control loop is coupled to the a wavelength measurement and the tuning member. In response to a detected change in wavelength, the control loop sends an adjustment signal to the tuning member. The tuning member adjusts a voltage or current supplied to the laser to provide a controlled output beam of selected wavelength.

DETAILED DESCRIPTION

Figure 1:
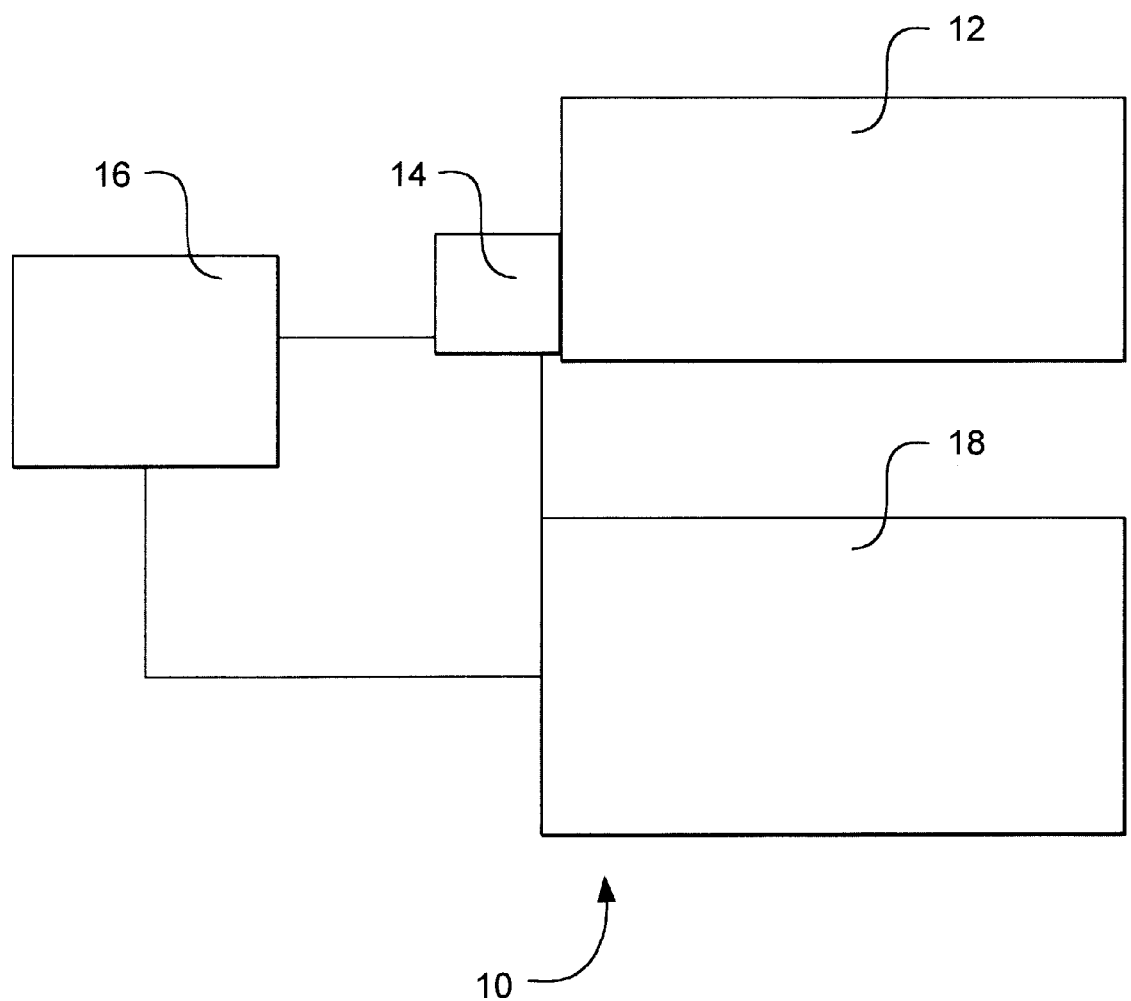
FIG. 1 is a block diagram of one embodiment of a tunable semiconductor laser system of the present invention with a wavelength tuning member and a temperature sensor.

Referring to FIG. 1, one embodiment of the present invention is a tunable semiconductor laser system is generally denoted as numeral 10 and includes a laser 12. Laser 12 is preferably tunable and generates a divergent output beam. Laser 12 can be any single mode semiconductor diode laser. Preferably, laser 12 is a vertical cavity surface emitting laser (VCSEL), an output facet of a single mode fiber (SMF) or an edge emitting laser. The output beam from laser 12 is preferably utilized for communication applications, with a wavelength in the range of 800 nm to 1650 nm.

Laser 12 has a semiconductor active region positioned between upper and lower confining regions of opposite type semiconductor material. Laser 12 also includes first and second reflectors positioned at opposing edges of the active and confining regions. A wavelength tuning member 14 and a temperature sensor 16 are each coupled to laser 12. A control loop, denoted as 18, is coupled to temperature sensor 16 and tuning member 14. In response to a detected change in temperature of laser 12, control loop 18 sends an adjustment signal to tuning member 14. Tuning member 14 adjusts either voltage or current supplied to laser 12 in order to provide a controlled output beam of a selected wavelength. System 10 does not require active cooling and is suitable for use in WDM communication systems.

Preferably, laser 12 is a tunable laser. Suitable lasers 12 include but are not limited to are 3 stage and 4 stage DFB lasers and tunable VCSEL lasers. In addition, an applied voltage or current controls the output power of the laser. Laser 12 can include a sealing cap, as disclosed in U.S. Pat. Application, Attorney Docket No. 21123-703, filed on the same date as this application, and incorporated herein by reference.

Figure 2:
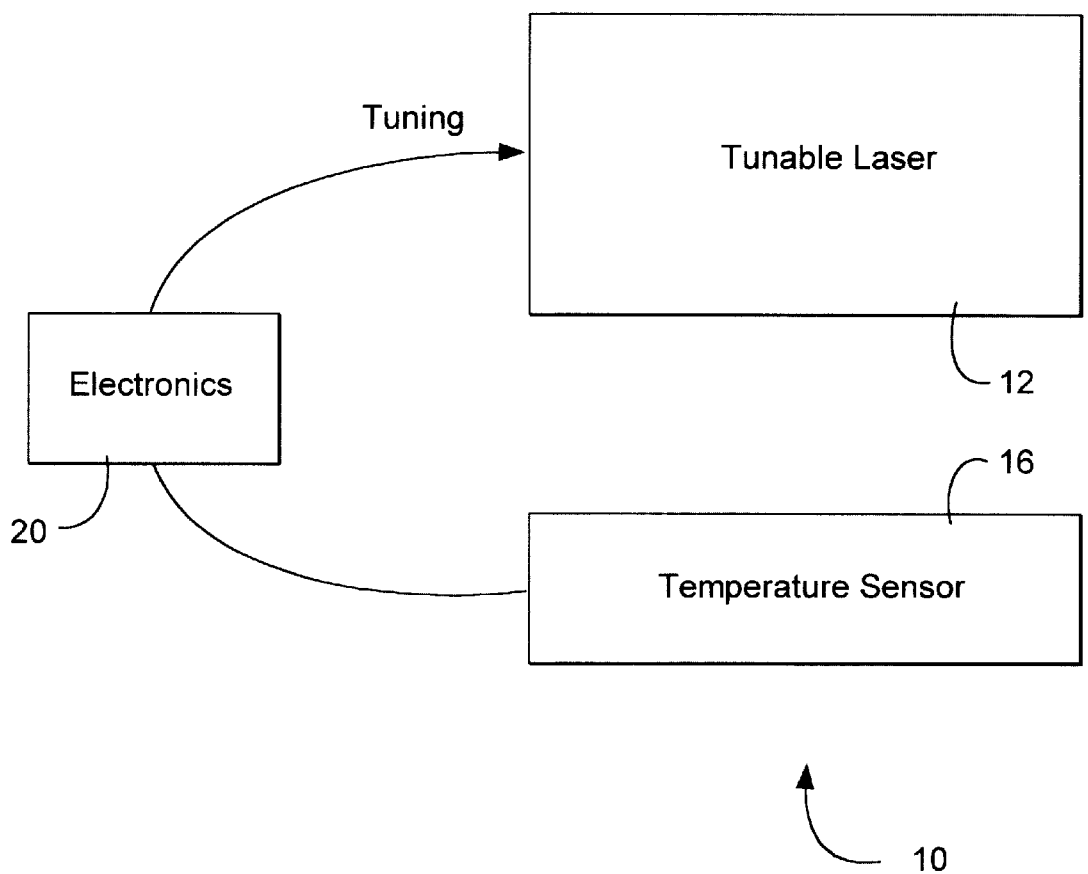
FIG. 2 is a block diagram of one embodiment of the present invention with a closed loop scheme for wavelength stabilization.

In one embodiment of system 10, illustrated in FIG. 2, only the output power and the temperature of laser 12 are measured. The output power of laser 12 is kept constant by controlling the power applied to laser 12 in a closed feedback loop. The wavelength of laser 12 is controlled in an open loop where a control circuit tunes laser 12 to correct for a calibrated wavelength drift according to the measured temperature. Electronics 20 are employed in both the open and closed feedback loops and include but are not limited to op-amplifiers, resistors, capacitors, transistors and the like.

Figure 3:
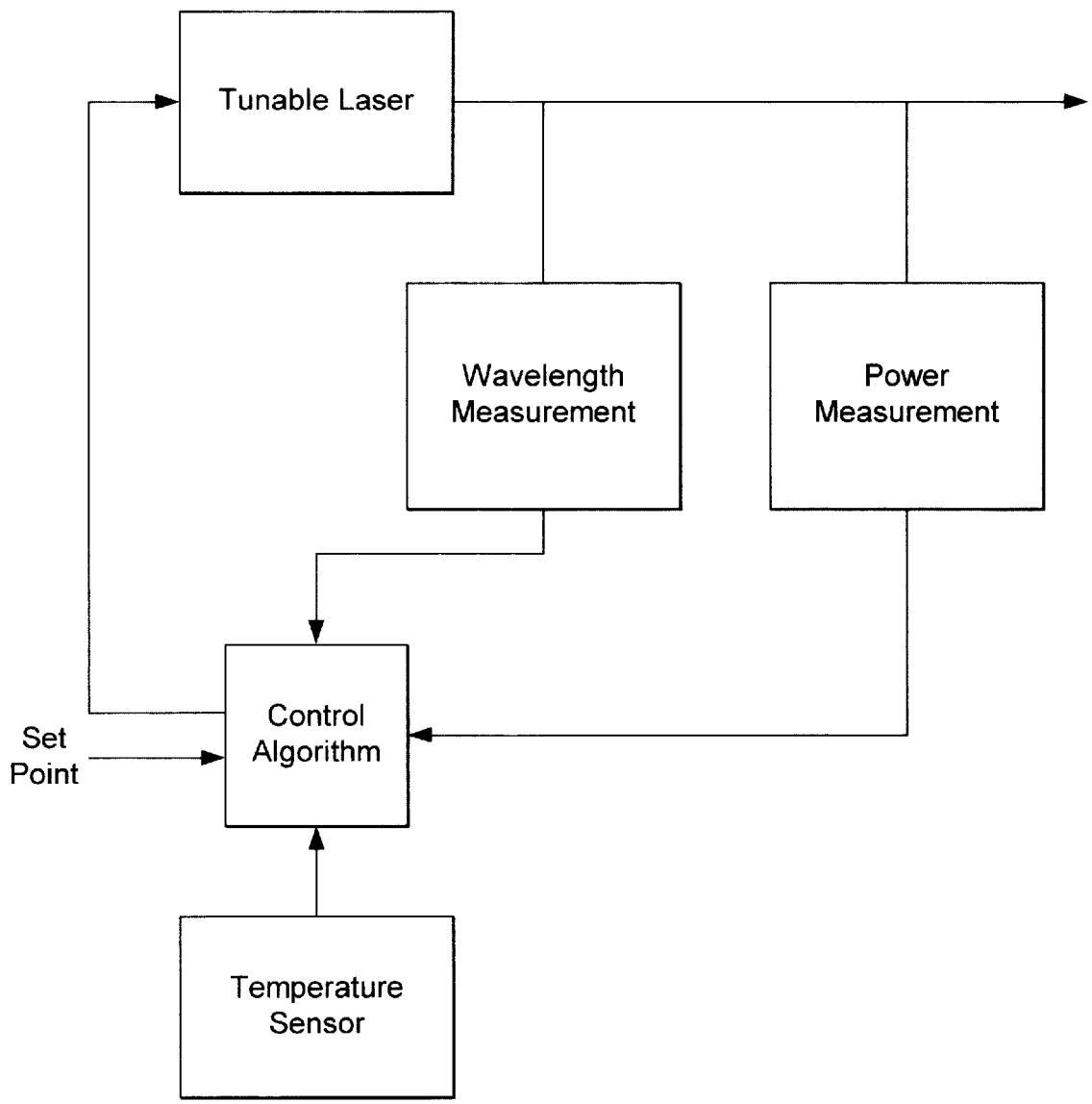
FIG. 3 is a block diagram of an embodiment of the present invention illustrating correction of a wavelength meter response with temperature in a control circuit.

In another embodiment of system 10, illustrated in FIG. 3, both the output power and the wavelength of laser 12 are measured. Closed feedback loops control both the laser power and the laser wavelength. The temperature is also measured, and the measurement is used to correct any error due to temperature in the wavelength and power measurements. The wavelength of laser 12 is stabilized in a closed feedback loop in which the wavelength of the laser output is measured. Temperature measurement is used to correct for the known temperature drift of the wavelength measurement and the power measurement.

Suitable temperature sensors 16 include but are not limited to thermistors, bipolar transistors, diode circuits and the like. Temperature sensor circuits for use with silicon CMOS technology are described in U.S. Pat. 5,829,879 and "CMOS-Compatible Smart Temperature Sensors" by R. A. Bianchi et. al., Microelectronics Journal v. 29, pp. 627–636 (1998), all incorporated herein by reference.

Figure 4A:
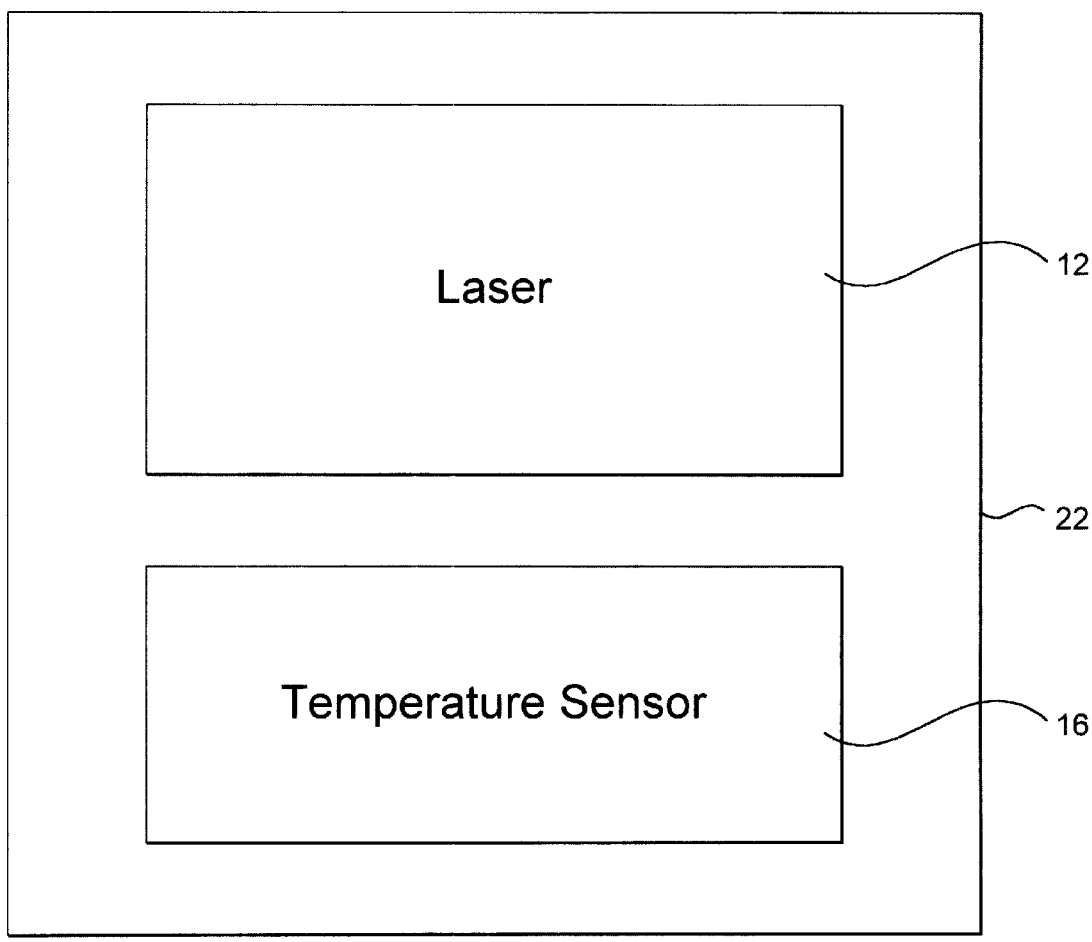
FIG. 4(a) is a schematic diagram of the tunable semiconductor laser system of FIG. 1 with the laser and temperature integrated on a chip.

Referring to FIG. 4(a), laser 12 and sensor 16, including but not limited to a transistor or diode temperature measurement circuit, can be positioned and/or formed on the same substrate or chip 22. This is particularly advantageous for surface emitting devices. Another temperature measurement technique implemented on the same chip 22 is a bimetallic cantilever. (See "Micromechanics: A Toolbox for Femtoscale Science: 'Towards a Laboratory on a Tip.'" by R. Berger et. al., Microelectronic Engineering v. 35, pp. 373–379 (1997)), incorporated herein by reference.

After system 10 is turned on, a current I is applied to laser 12 so that laser 12 produces an optical power P, and a voltage V is applied to the laser tuning mechanism so that the lasing wavelength is λ. A small fraction of the output of laser 12 is sent through a wavelength selective filter, including but not limited to a Fabry-Perot etalon and into a detector.

Figure 4B:
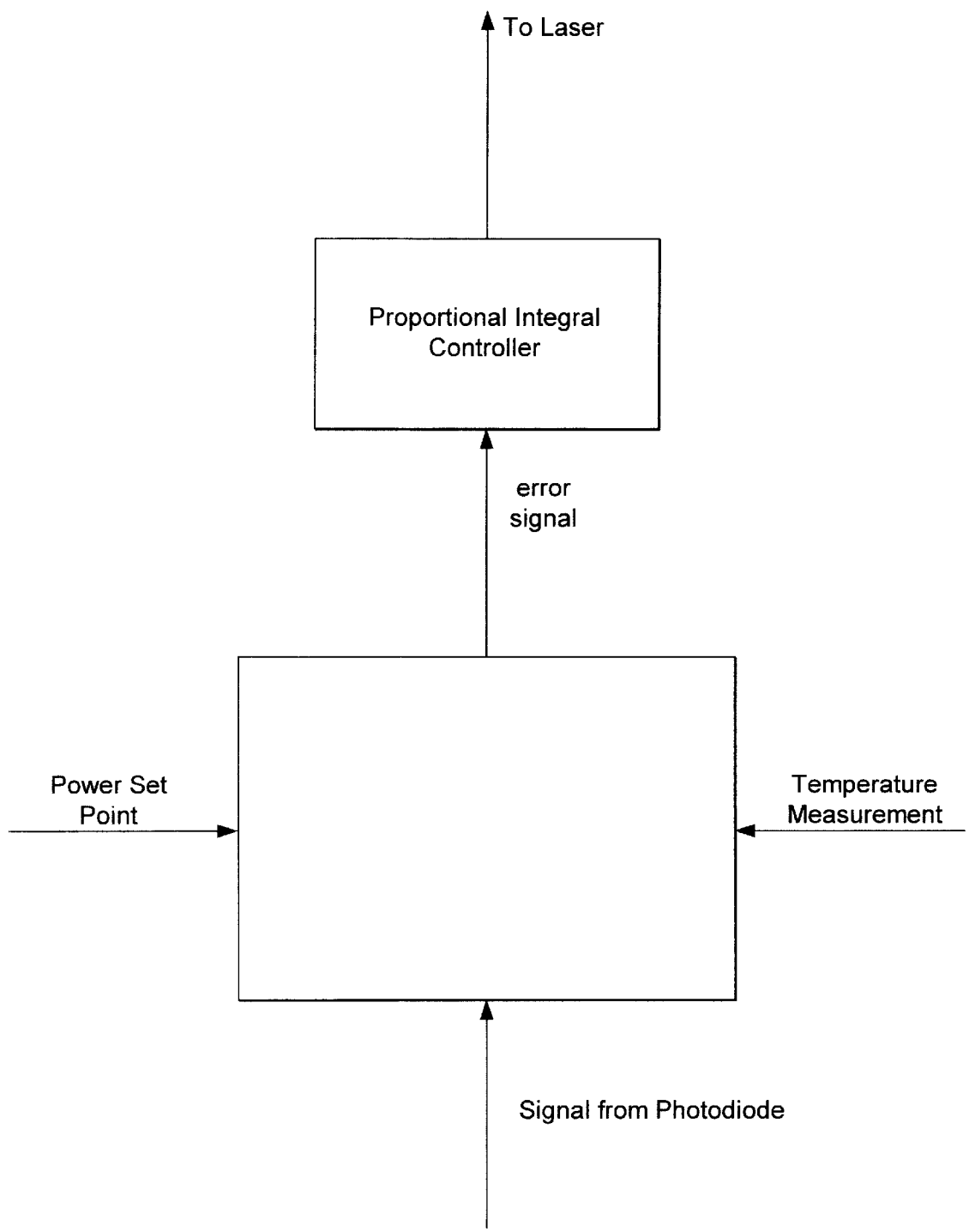
FIG. 4(b) is a block diagram illustrating an embodiment of the apparatus of FIG. 1 with the generation of an error signal when temperature correction is needed.

As illustrated in FIG. 4(b) temperature sensor 16 supplies a current or voltage proportional to the temperature which is subtracted off (or added to) the detector current to correct for the temperature drift of the Fabry-Perot etalon. The corrected detector current is compared to a set current which corresponds to a predetermined wavelength, λ0. If λ is greater than λ0, the measured detector current will be smaller than the set current, as more fully described hereafter and illustrated in FIGS. 19(a) and 19(b), and if λ is less than λ0, the measured current will be greater than the set current. The difference between the measured and set current is sent through a proportional-integral circuit which applies a voltage to tuning member 14. If λ is not equal to λ0, the voltage applied to tuning member 14 increases (or decrease) until λ equals λ0 when the input to the circuit will be 0 and the voltage will stabilize at a constant value.

In a similar manner, a small fraction of the output of laser 12 is sent directly into the detector to monitor laser 12 power. A current proportional to the temperature is subtracted off (or added to) the detector current to compensate for the change in detector response with temperature. This corrected current is then compared to a set value which corresponds to the desired output power of laser 12. The difference between the corrected detector current and the set current is sent to a proportional integral circuit which will apply a current to laser 12. If the laser power is to low, the current to laser 12 is increased by the circuit until it is at the proper value, and if the power is too high, the current is decreased.

In this way, the power and wavelength of system 10 output remains constant despite changes in the temperature.

One embodiment of laser 12 is a VCSEL with a cantilever apparatus that uses an electrostatic force that pulls on a cantilever arm. The mechanical deflection resulting from this electrostatic force is used to change the length of the laser's Fabry-Perot microcavity and consequently to the resonance wavelength.

Figure 5:
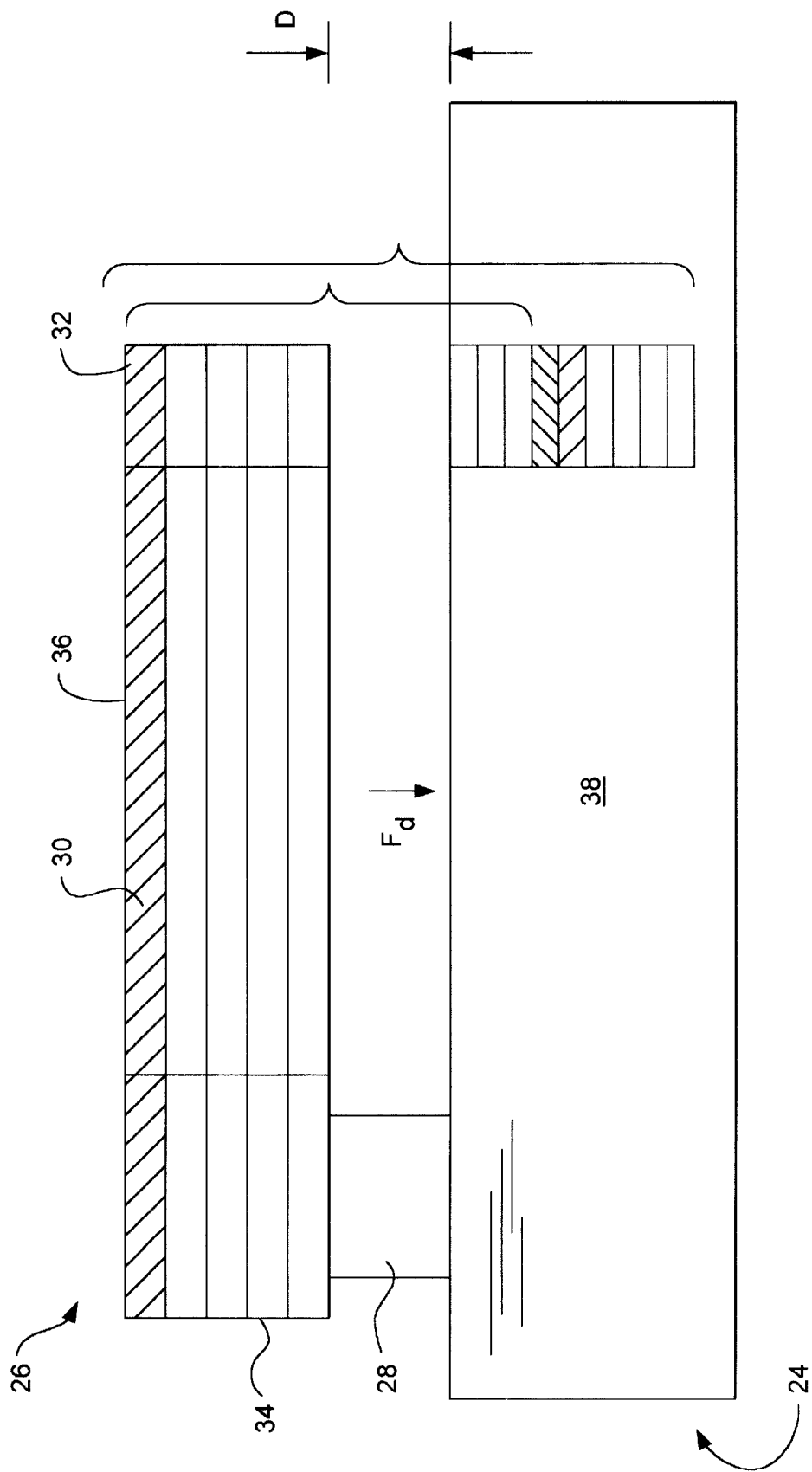
FIG. 5 is a sectional view of a VCSEL laser that can be used with the assembly of FIG. 1.

As illustrated in FIG. 5, cantilever apparatus 24 has a cantilever structure 26 consisting of a base 28, an arm 30 and an active head 32. The bulk of cantilever structure 26 may consist of a plurality of reflective layers 34 which form a distributed Bragg reflector (DBR). Layers can be formed of different materials including but not limited to AlGaAs. Different compositional ratios are used for individual layers 34, e.g., $Al_{.09}Ga_{.91}As/Al_{.58}Ga_{.42}As$. The topmost layer is heavily doped to ensure good contact with an electrical tuning contact 36 deposited on top of cantilever structure 26.

The actual number of layers 34 may vary from 1 to 20 and more, depending on the desired reflectivity of the DBR. Furthermore, any suitable reflecting material other than AlGaAs may be used to produce layers 34. Active head 32 is made of layers 34. However, arm 30 and base 28 do not need to be made of layers 34.

Base 28 can have a variety of different geometric configurations and large enough to maintain dimensional stability of cantilever structure 26. The width of arm 30 ranges typically from 2 to 8 mu m while its length is 25 to 100 mu m or more. The stiffness of arm 30 increases as its length decreases. Consequently, shorter cantilevers require greater forces to achieve bending but shorter cantilevers also resonate at a higher frequency. The preferred diameter of active head 32 falls between 5 and 40 mu m. Other dimensions are suitable.

Figure 6:
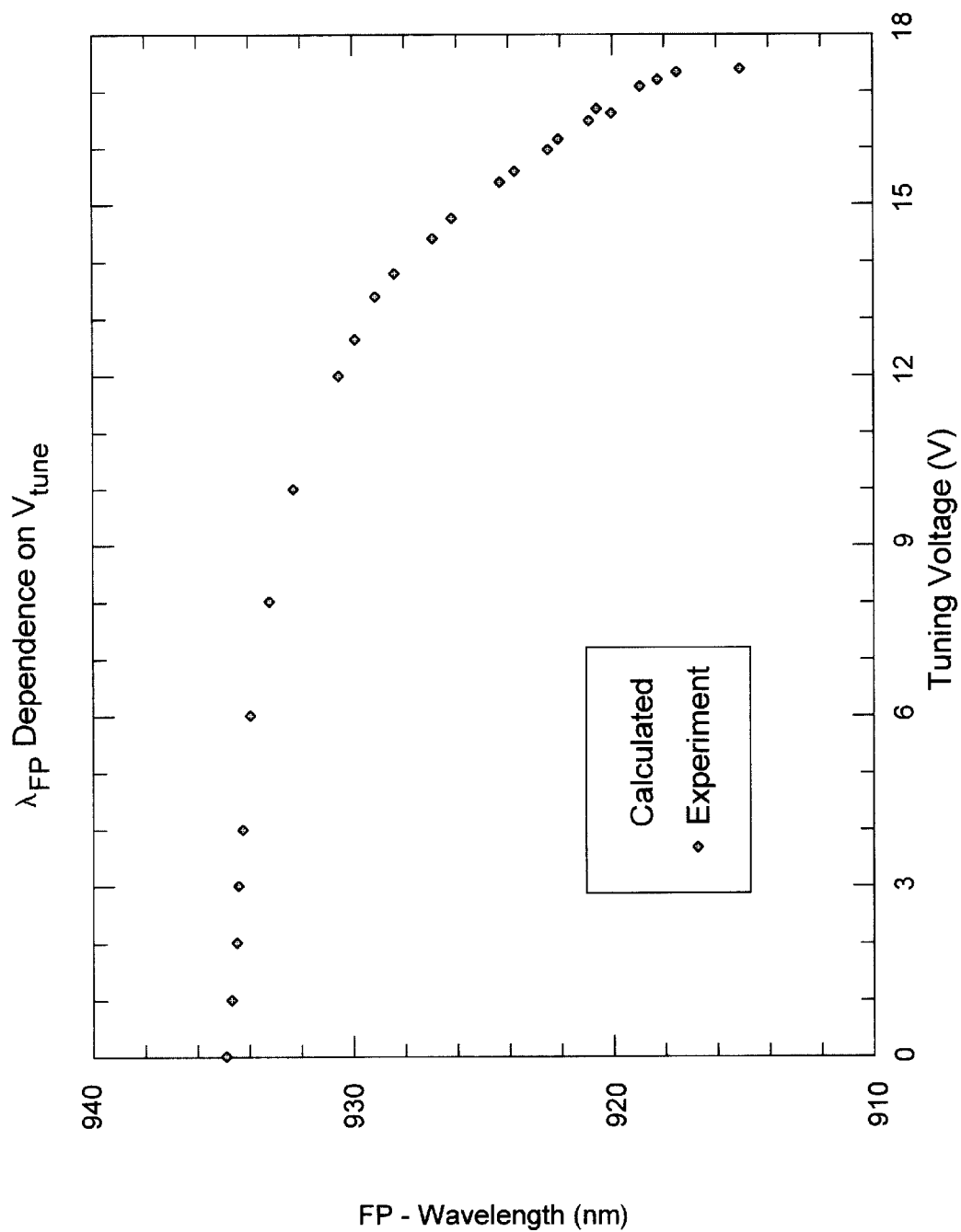
FIG. 6 is a graph illustrating a voltage wavelength relationship of the device of FIG. 5.

Electrical tuning contact 36 resides on all or only a portion of a top of cantilever structure 26. Tuning contact 36 is sufficiently large to allow application of a first tuning voltage $V_{tl}$. Base 28 is coupled to a single support post 37 and mounted on a substrate 38 across which a voltage can be sustained. Substrate 38 can include a second DBR 39. The relationship between voltage and wavelength is shown in FIG. 6. FIG. 6 illustrates a one-to-one relationship between voltage and wavelength. In certain embodiments, relationship is a linear relationship.

Figure 7:
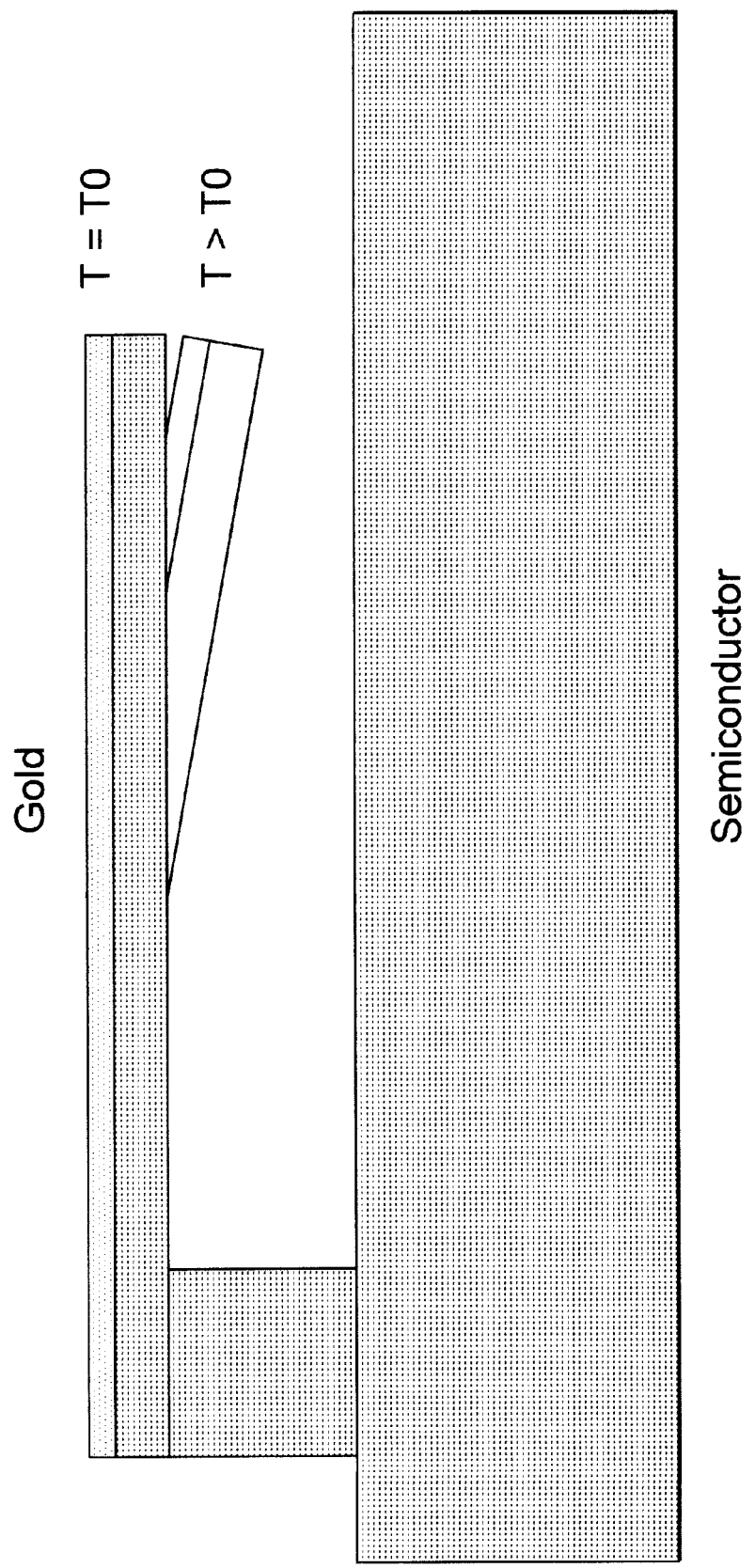
FIG. 7 illustrates movement of the cantilever structure of the VCSEL laser of FIG. 5 in response to a change in wavelength.

Substrate 38 can be made of the same material as layers 34. A voltage difference between layers 34 and substrate 38 causes a deflection of arm 30 towards substrate 38 as shown in FIG. 7. If layers 34 and substrate 38 are oppositely doped, then a reverse bias voltage can be established between them. Substrate 38 is sufficiently thick to provide mechanical stability to entire cantilever apparatus 24. Inside substrate 38 and directly under active head 32 are one or more sets of reflective layers with each set forming a second DBR. A more complete description of cantilever apparatus 38 is disclosed in U.S. Pat. No. 5,629,951, incorporated herein by reference.

Figure 8:
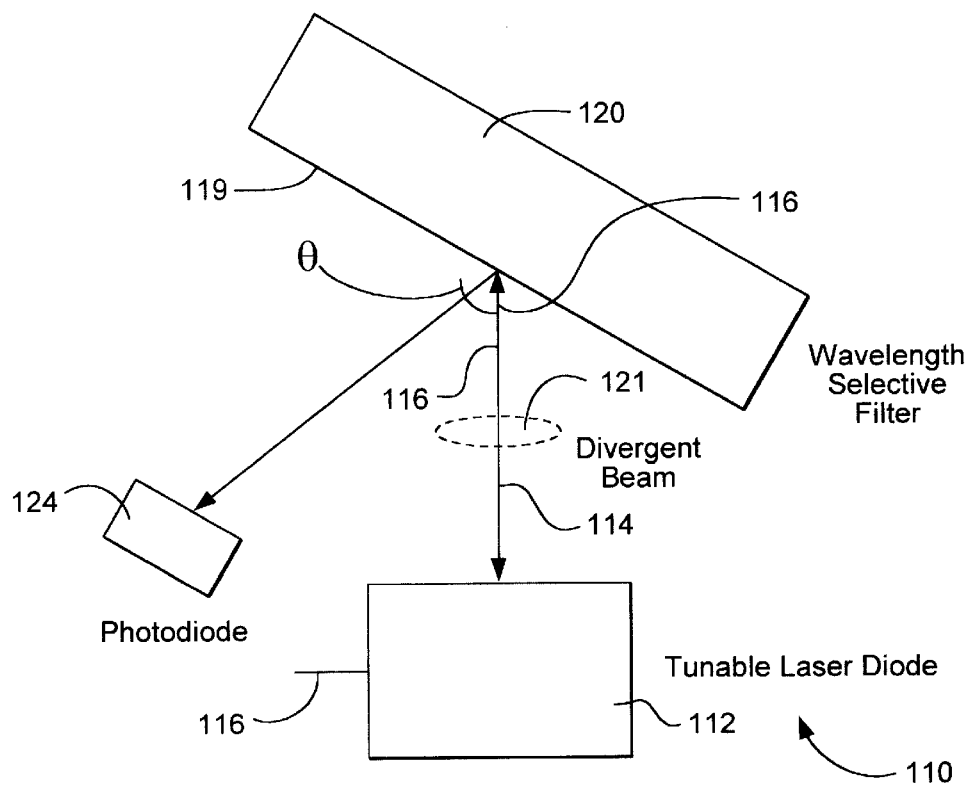
FIG. 8 is a schematic diagram of an embodiment of a monitoring and control assembly, used with the assembly of FIG. 1, with a wavelength selective filter positioned at an angle relative to an output face of a laser.

Referring now to FIG. 8, system 110 can also include is one or more photodetectors 124. Photodetector 124 can be an avalanche photodiode, a PIN photodiode, a metal-semiconductor-metal detector, and the like. Preferably, photodetector 124 is a PIN photodiode. Photodetector 124 converts optical energy into an electric current. Changes in electric current are used for monitoring and control of laser 112. Two or more photodetectors may be employed. In one embodiment, an array of photodetectors 124 is utilized. More than one photodiode 124 can be used greater discrimination in monitoring and control of laser 112, as more fully described hereafter.

Figure 9:
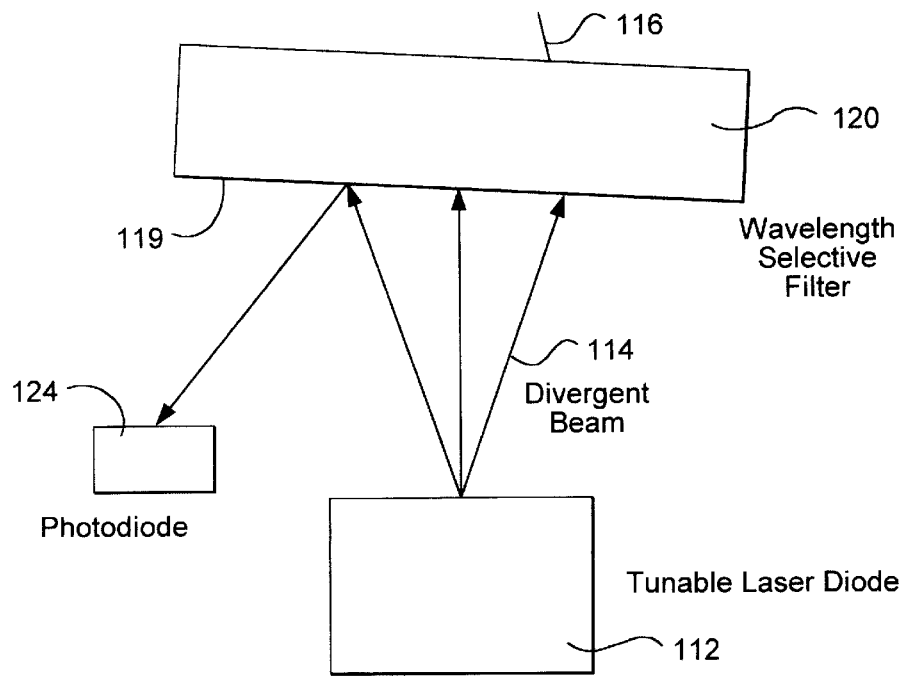
FIG. 9 is a schematic diagram of the assembly of FIG. 1 illustrating a change of the angle of the wavelength selective filter relative to the output face of the laser.

Positioned along optical axis 116 is a wavelength selective filter 120. Suitable wavelength selective filters 120 include but are not limited to a Bragg grading, multilayer-thin-film filter, solid Fabry-Perot etalon or an air gap etalon. Preferably wavelength selective filter 120 is a Fabry-Perot etalon or a multilayer-thin-film filter. Wavelength selective filter 120 can be tilted at an angle θ relative to optical axis 116 to provide an angular dependence of a wavelength reflection of wavelength selective filter 120 and direct the reflected output beam 114 towards photodetector 124. FIG. 9 illustrates a change in angle θ. Wavelength selective filter 120 is distanced from laser 112 and tilted at the angle θ relative to optical axis 116 in order to provide an angular dependence of wavelength reflection from wavelength selective filter 120. Wavelength selective filter 120 directs the reflected output beam 114 in a direction towards photodetector 124.

Wavelength selective filter 120 splits incident output beam 114 into a transmitted portion and a reflected portion. The ratio of the transmitted and reflected portions is a function of wavelength of output beam 114 and the angle θ that is defined by an incident face 119 of wavelength selective filter 120 relative to the incident beam.

Received power by photodetector 124 is a function of wavelength. When the wavelength of output beam 114 changes, there is change in received power by photodetector 124. When the total output power of output beam 114 is a constant, any change in received power at photodetector 124 is used as an indication that there has been a change in the wavelength of laser 112.

When wavelength selective filter 120 reflects a portion of output beam 114 to photodetector 124, the result is a compact assembly that can be an integral unit with monolithic integration of laser 112 with photodetector 124 on the same chip.

The divergence of laser 112 can be controlled by a lens 121 which can be an aspherical lens, a cylindrical lens, a spherical lens, a graded index lens of plastic or glass, and the like. A larger spot size gives wavelength selective filter 120 a shape closer to desired and provides better power transfer to photodetector 124.

For dense WDM applications, where precise wavelengths are required, a differential detection scheme is utilized to further enhance accuracy. A differential detection scheme compares the output from a pair of photodetectors 124. When there is an array, there is still a comparison between a pair of adjacent or non-adjacent photodetectors 124, one comparison made at a time. With a pair of photodetectors 124, a difference in response of the two photodetectors 124 is used to determine wavelength deviation from a pre-set wavelength.

Figure 10:
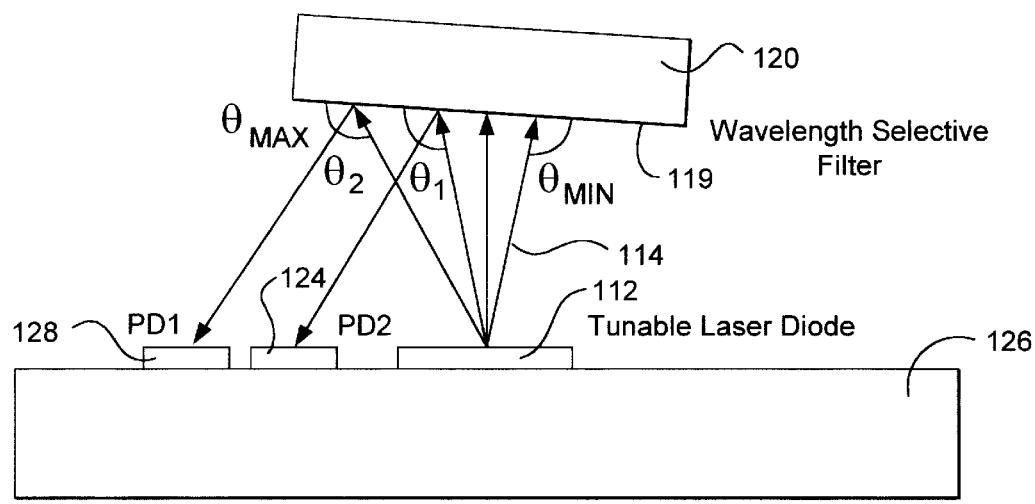
FIG. 10 is a schematic diagram of another embodiment of a monitoring and control assembly, used with the system of FIG. 1, with two photodetectors and a wavelength selective filter positioned at an angle relative to an output face of a laser.

Usually, output beam 114 is divergent. This divergence is used as an advantage for differential detection schemes. As illustrated in FIG. 10, when output beam 114 is divergent there is a range of incident angles $\theta_{min}$ to $\theta_{max}$ on face 119. The larger the divergence, the larger the difference between $\theta_{min}$ and $\theta_{max}$. When laser 112, photodetector 124 and wavelength selective filter 20 are in fixed positions relative to each other, and a beam receiving area of photodetector 124 is small, photodetector 124 only receives the portion of reflected output beam 114 with a particular incident angle $\theta_1$.

In FIG. 10 a second photodetector 128 is included and positioned adjacent to photodetector 124. In this embodiment, two different parts of output beam 114 are incident on photodetectors 124 and 128. A change in wavelength from laser 112 is converted to a difference in transmission detected by photodetectors 124 and 128.

Figure 11:
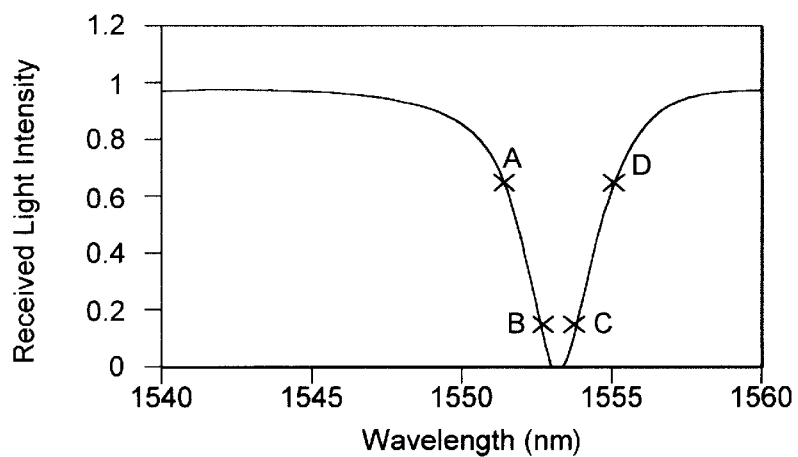
FIG. 11 is a graph illustrating light reflected from the wavelength selective filter and received by the photodetector of FIG. 8 when the wavelength of the light output from the laser changes.

FIG. 11 illustrates in one example of light reflected off wavelength selective element 120 that is received by photodiode 124 when the wavelength of the light output from laser 112 changes. The sharp changes at the 1552 nm region may be utilized for wavelength change detection between points A–B and C–D shown in FIG. 11.

Referring again to FIG. 10, second photodetector 128 is distanced from first photodetector 128 and receives a different portion of the reflected output beam 114 with a different incident angle $\theta_2$. Because of the difference of the incidence angles, the optical path lengths are different for the two portions of output beam 114 received by the respective photodetectors 124 and 128. Therefore, the relationship between the received power at each photodetector 124 and 128 verses wavelength is shifted.

Figure 12:
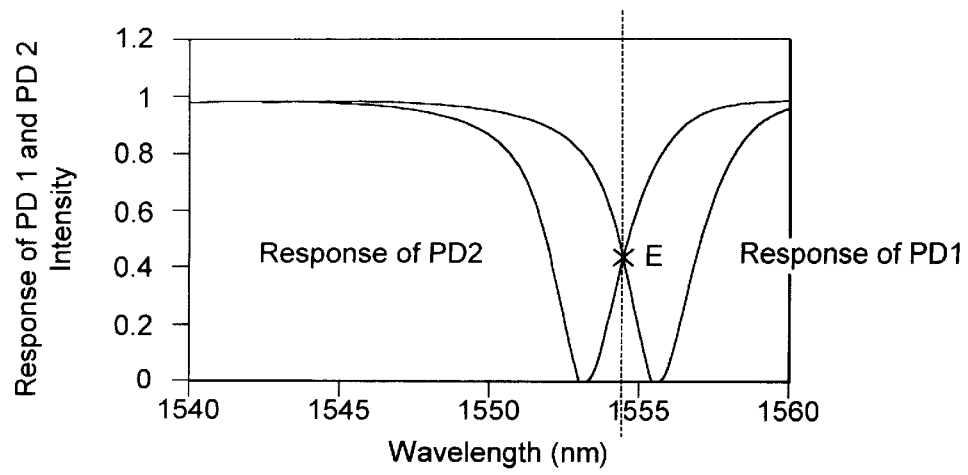
FIG. 12 is a graph illustrating the response expressed as intensity as a function of wavelength of the two photodetectors of FIG. 10.

This shift is determined by the distance between photodetectors 124 and 128, their distance from face 119 of wavelength selective element 120, and the distance between wavelength selective element 120 to laser 112, as illustrated in FIG. 12. At point E, at which the responses from photodetectors 124 and 128 are equal, this is used in setting up the target wavelengths for wavelength locking purposes. Any deviation from the wavelengths results in a difference in response intensity at the two photodetectors. This difference can be used in a feedback control loop to change the wavelength of laser 112 back to the target wavelength, as described in greater detail hereafter. In WDM applications each communication channel is set at a predetermined wavelength. The wavelength of each transmitter output should be stabilized to much better than the channel spacing. For example, for 50 GHz channel spacing, the wavelengths should be stabilized to at least 5 GHz.

Figure 13:
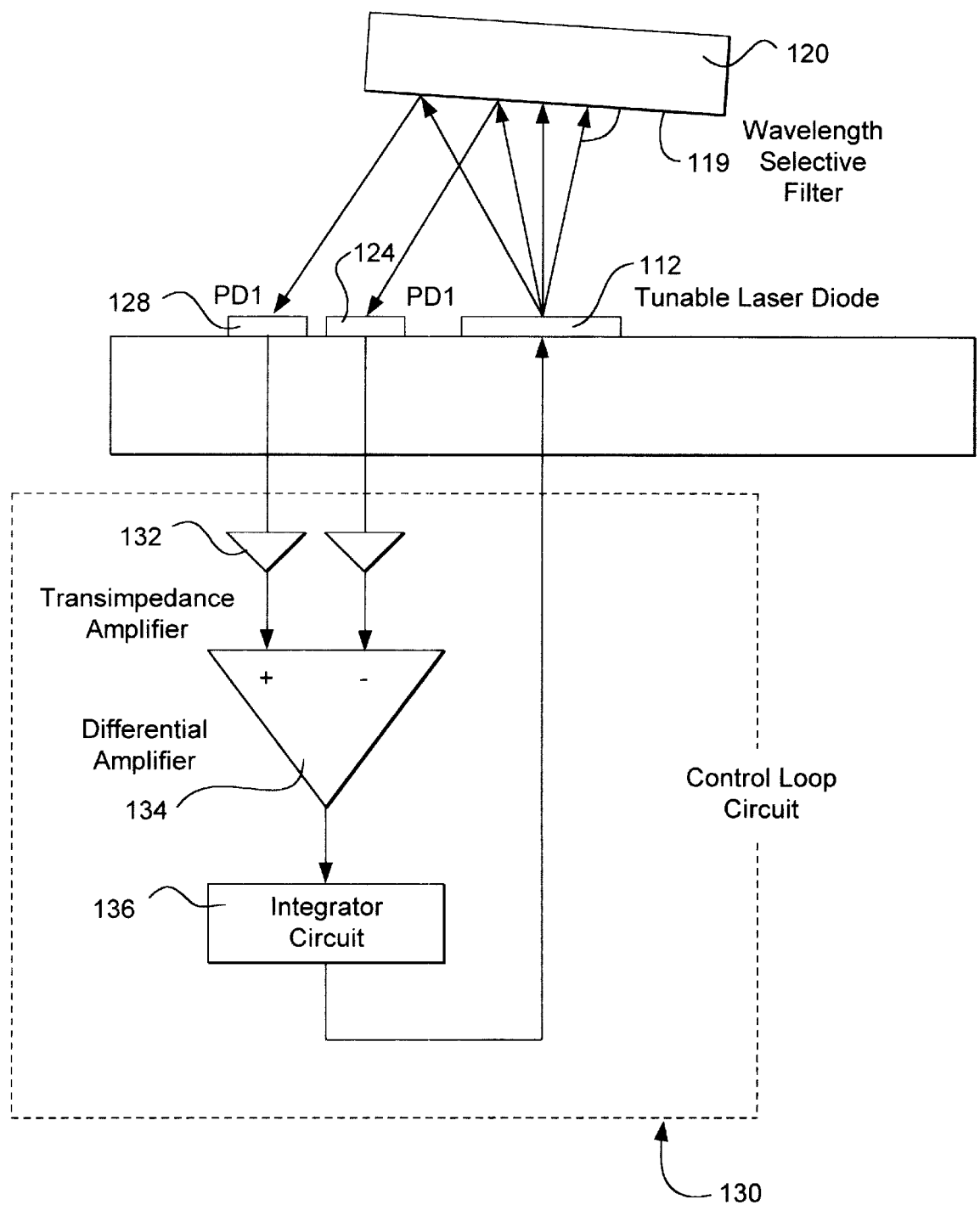
FIG. 13 is a schematic diagram of a control loop circuit in combination with the assembly of FIG. 10.

Referring now to FIG. 13, one embodiment of a control loop circuit, generally denoted as 130, is coupled to photodetectors 124 and 128 and laser 112. Control loop circuit 130 includes a transimpedance amplifier 132, a differential amplifier 134 and an integrator circuit 136. Control loop 130 provides a feedback of a difference signal generated by photodetectors 124 and 128 in response to a change in wavelength of laser 112. Control loop circuit 130 provides wavelength stabilization of the laser in response to a change in wavelength of laser 112.

Photodetectors 124 and 128 convert optical energy to a current for a feedback loop for controlling laser 112. The wavelength of laser 112 determines how much of output beam 114 is reflected by wavelength selective filter 120. The signal received by each photodetector 124 and 128 is dependent on the wavelength emitted by laser 112. Because of the angular dependence of wavelength selective filter 120 a wavelength variation from laser 112 is converted to a transmission and reflection change. The wavelength change is detected as a power change. In one embodiment, the output signals from photodetectors 124 and 128 are used to generate a difference signal in differential amplifier 134 which is fed to integrator circuit 136 for controlling the output wavelength of laser 112. By arranging that the reflection detected by photodetectors 124 and 128 is the same at a selected wavelength, the difference signal is set to be zero at the predetermined wavelength (the locked wavelength). The locked wavelength can be set with equivalent stability to different values by using unequal gains for photodetectors 124 and 128. If the wavelength of laser 112 changes the differential signal generated by photodetectors 124 and 128, the error signal, is wavelength dependent and is used to monitor the wavelength of laser 112.

Monitoring and control of laser 112 is wavelength tunable by changing the angle of inclination $\theta$ of wavelength selective filter 120. Wavelength selective filter 120 can be mounted on an adjustable support with four degrees of freedom. Control loop circuit 130 is dependent on a number of different factors. These factors include, the wavelength selective filter 120 tilt angles in the x and y axis, the wavelength selective filter 120 index change with temperature, the photodetectors 124 and 128X and y axis offsets and the divergent angle of the incident beam from laser 112.

In various embodiments, laser 112 can be coupled with any number of photodetectors including an array, and form a monolithically integrated chip and/or an integral assembly. An array has a number of advantages including but not limited to, enhancing flexibility of geometry of assembly 110, providing photodetector redundancy to enhance reliability and lifetime and provides a larger range of wavelengths, for example to cover the entire wavelength range of 800 nm to 1650 nm. In one embodiment, assembly 110 can be used as a wavelength tuning and locking element.

Figure 14:
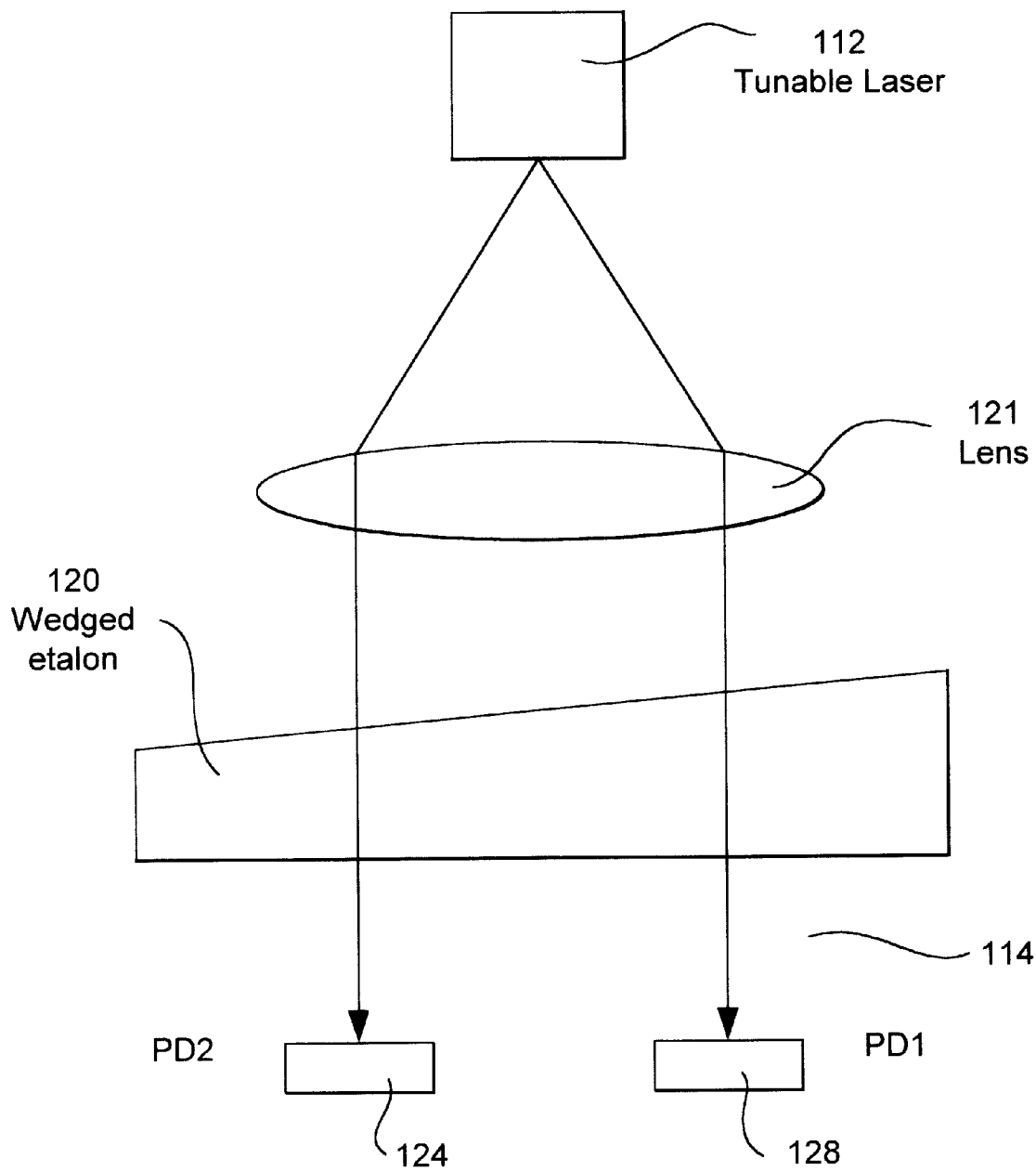
FIG. 14 is a schematic diagram of an embodiment of a monitoring and control assembly, used with the assembly of FIG. 1, with a wedged wavelength selective filter operating in a transmissive mode.

In another embodiment illustrated in FIG. 14, wavelength selective filter 120 has a wedged shape with a thickness that varies monotonically in a lateral direction. Output beam 114 is collimated by lens 121. Each photodiode 124 and 128 respectively, receives light that corresponds to different positions of wavelength selective filter 120 with a different thickness. With wedged shaped wavelength selective filter 120, each photodiode 124 and 128 has a distinct wavelength dependence. In one embodiment, the wedge angle of wavelength selective filter 120 is determined by a desired capture range. It is preferred that the capture range substantially match the deviation of emitted laser wavelengths from the targeted wavelengths.

Figure 15:
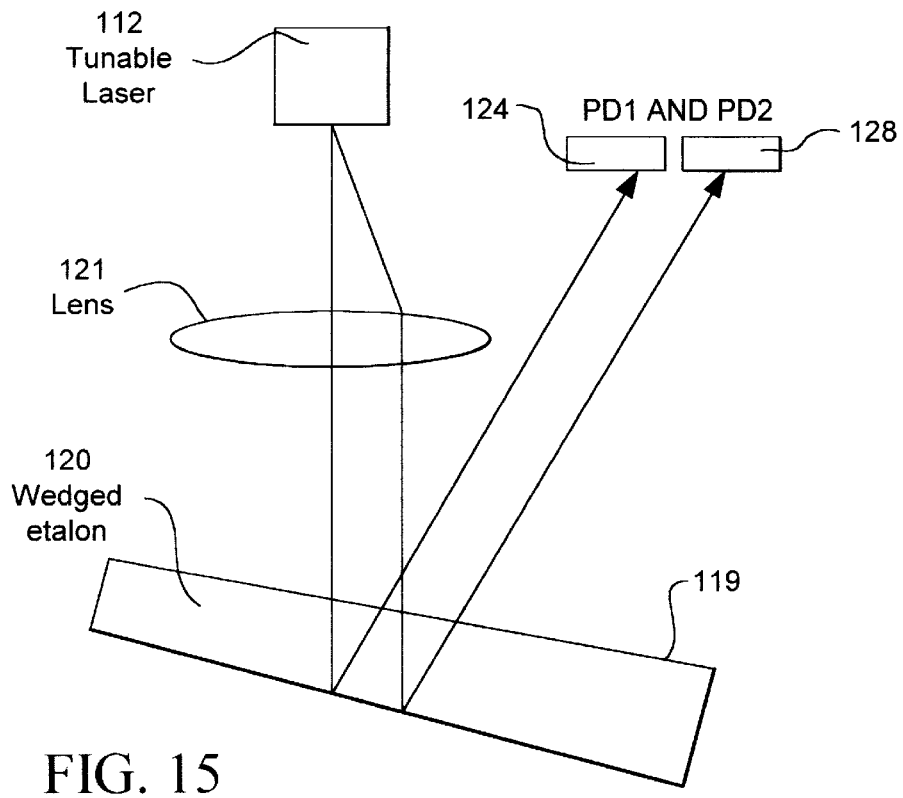
FIG. 15 is a schematic diagram of an embodiment of a monitoring and control assembly, used with the assembly of FIG. 1, with a wedged wavelength selective filter operating in a reflective mode.
Figure 16:
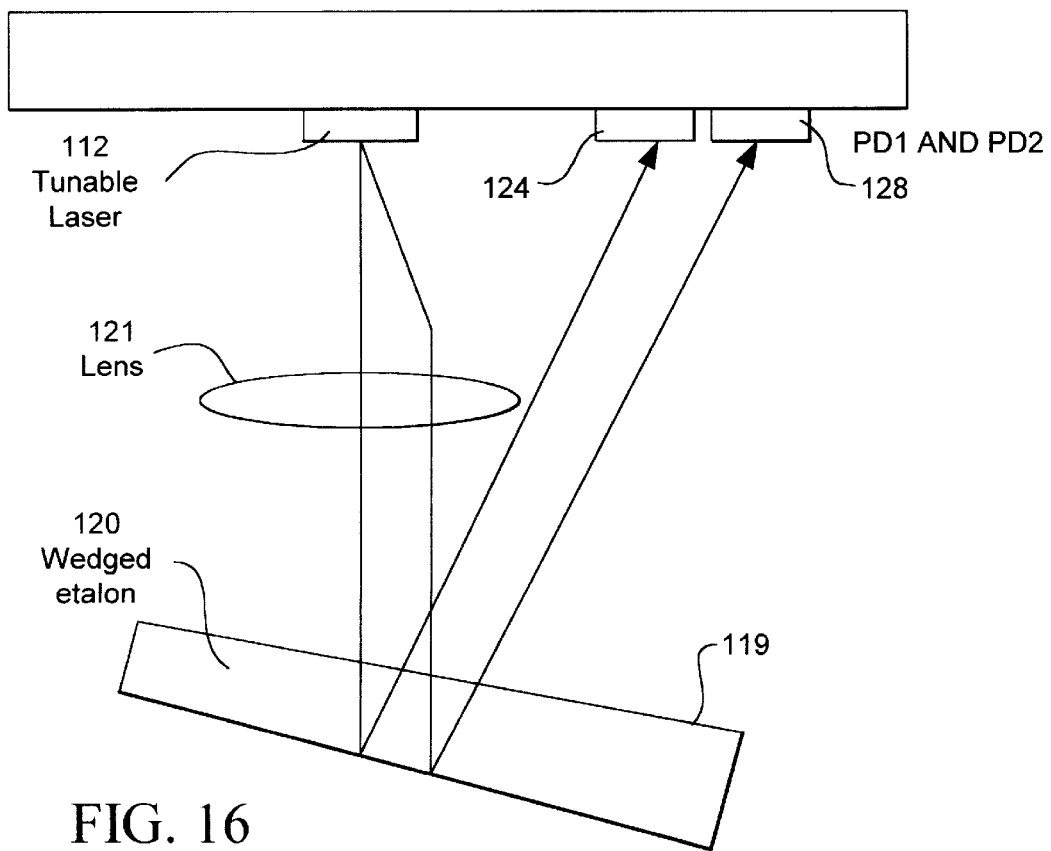
FIG. 16 is a schematic diagram of the assembly of FIG. 15 with the laser and photodiodes positioned on a common substrate.

Wedged selective wavelength filter 120 can be used in the reflective mode as illustrated in FIGS. 15 and 16.

Assembly 110 can be programmable. In WDM applications, a set of discrete wavelengths with equal spacing in frequency is defined as the ITU grid. It is desirable to have a programmable WDM source that can be set to any wavelengths on the ITU grid and stabilized at that wavelength per demand.

Figure 17:
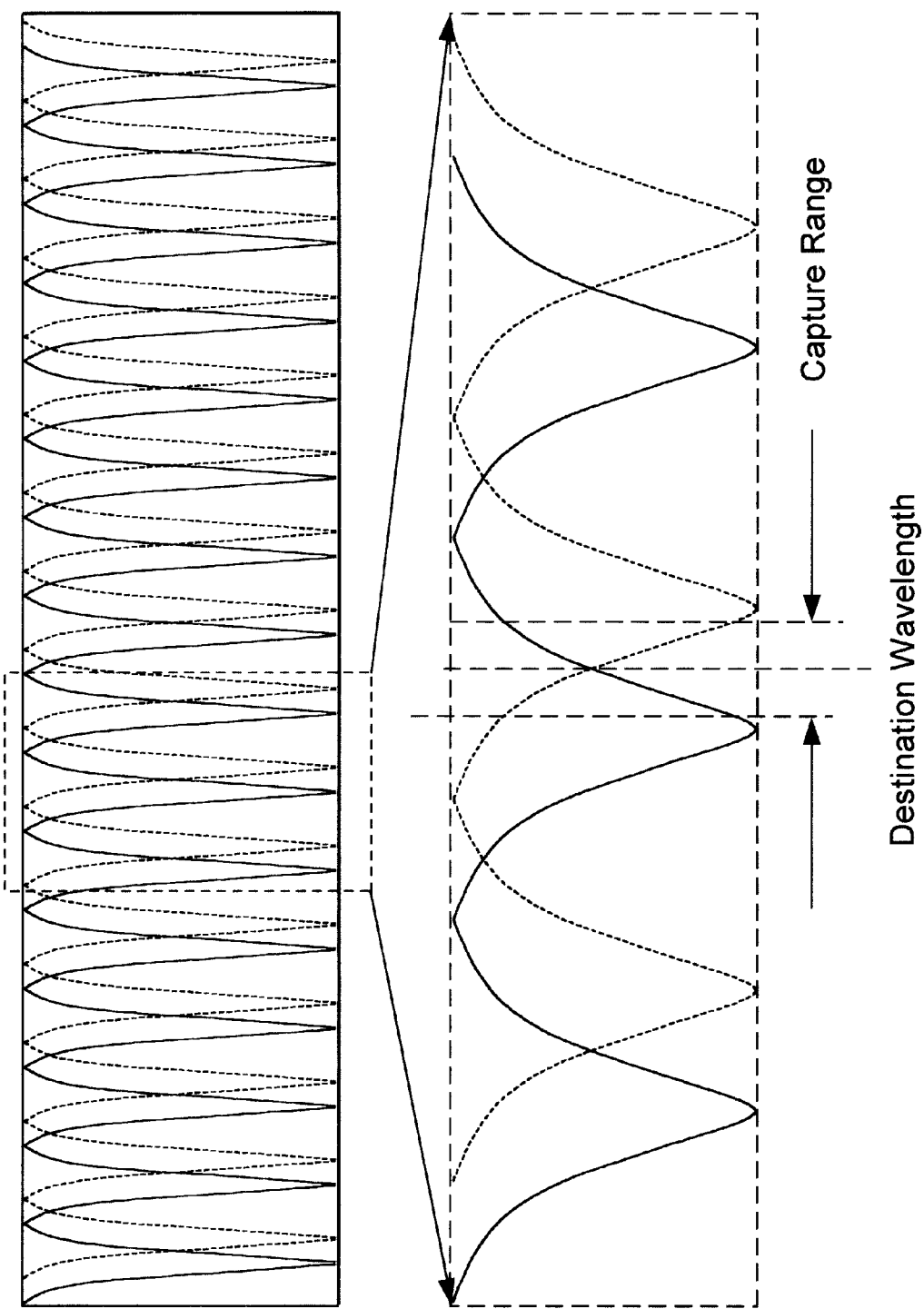
FIG. 17 is a graph illustrating an embodiment of the assembly of FIG. 1 where the free spectra range of the wavelength selective filter coincides with the ITU grid spacing.

In one embodiment, illustrated in FIG. 17, wavelength selective filter 120 can be an etalon with a free spectra range that coincides with the ITU grid spacing. During assembly, the response of photodiodes 124 and 128 is set up such that the locking wavelength coincides with the precise ITU grid wavelength. Assembly 110 can be programmable and tunable with voltage tuning, temperature tuning and current tuning.

Figure 18:
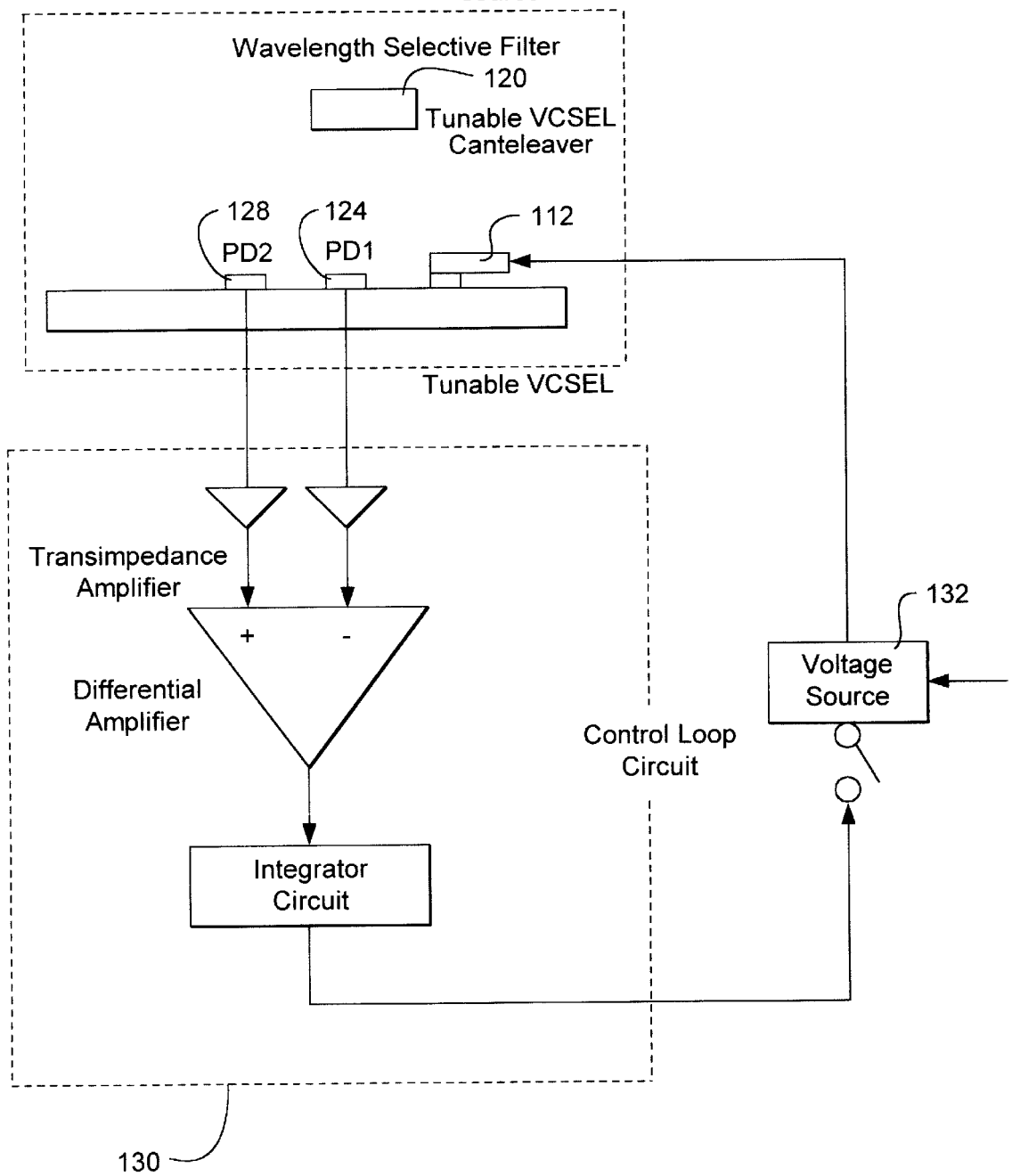
FIG. 18 is a schematic diagram of an embodiment of a monitoring and control assembly, used with the assembly of FIG. 1, that includes a control loop circuit and is programmable.

FIG. 18 illustrates a voltage tuning embodiment with a voltage source 132. The wavelength vs. tuning voltage characteristics of laser 12 are tabulated and saved. In the embodiment of FIG. 18, programmability can be achieved by, (i) disabling control loop circuit 130, (ii) stepping the voltage to the value that corresponds to the destination wavelength which may be saved in a look-up table in a memory chip and (iii) turning on control loop circuit 130.

Figure 19A:
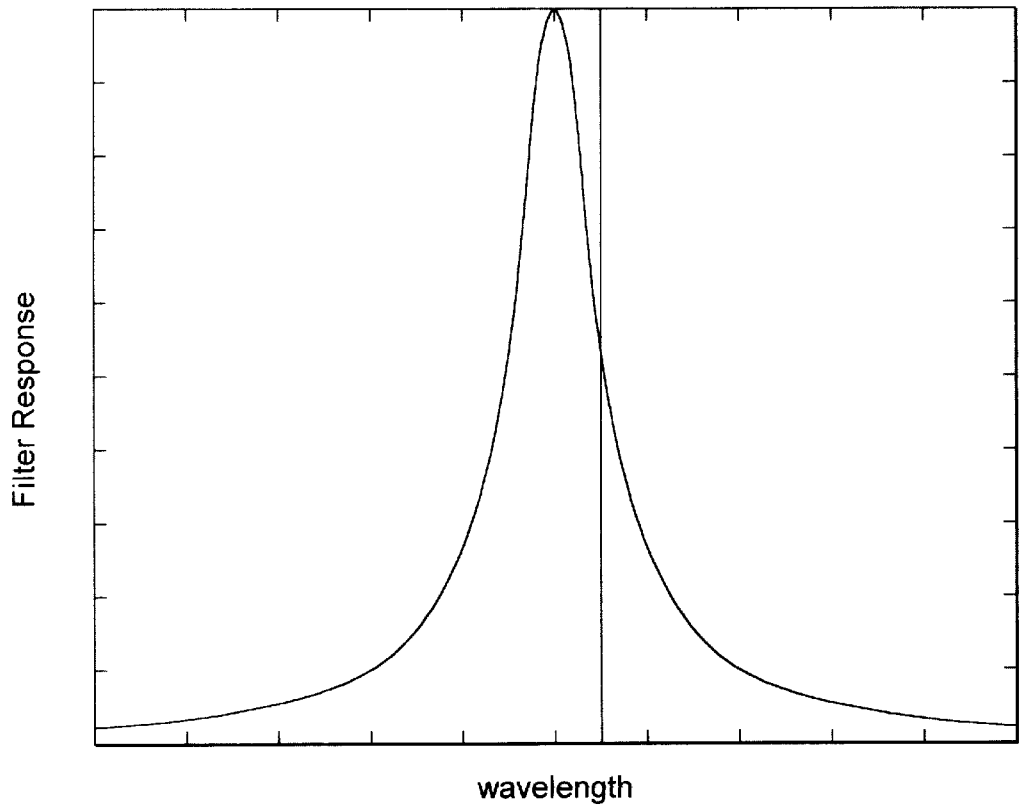
FIG. 19(a) is a graph illustrating filter transmission of an etalon.
Figure 19B:
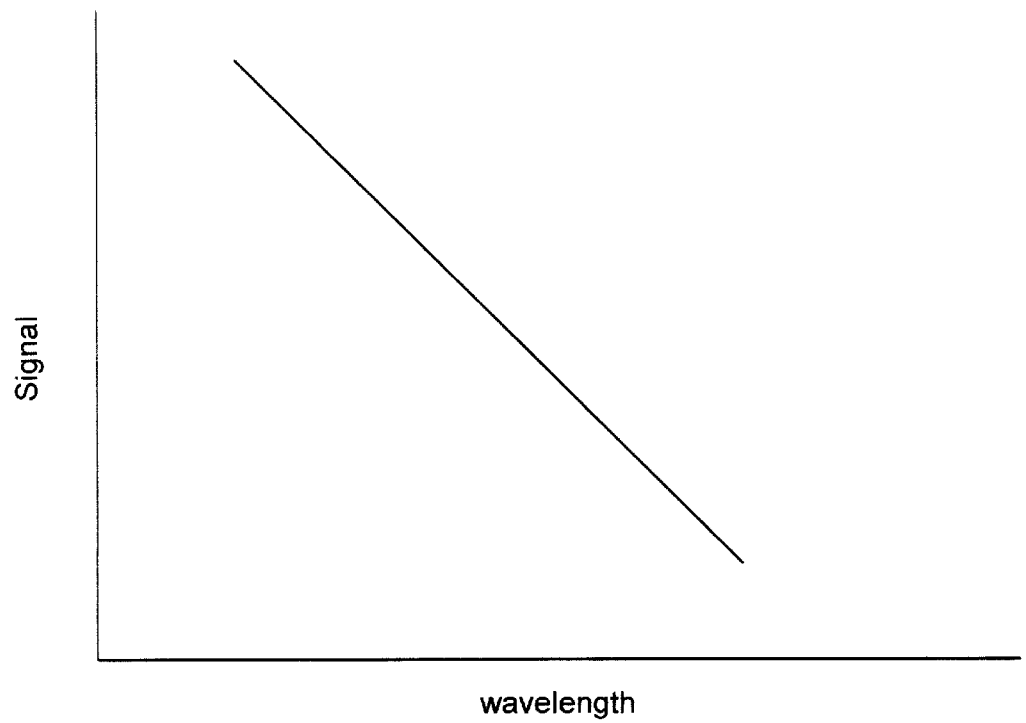
FIG. 19(b) is a graph illustrating the linear response near a targeted wavelength of the etalon of FIG. 19(a).
Figure 20:
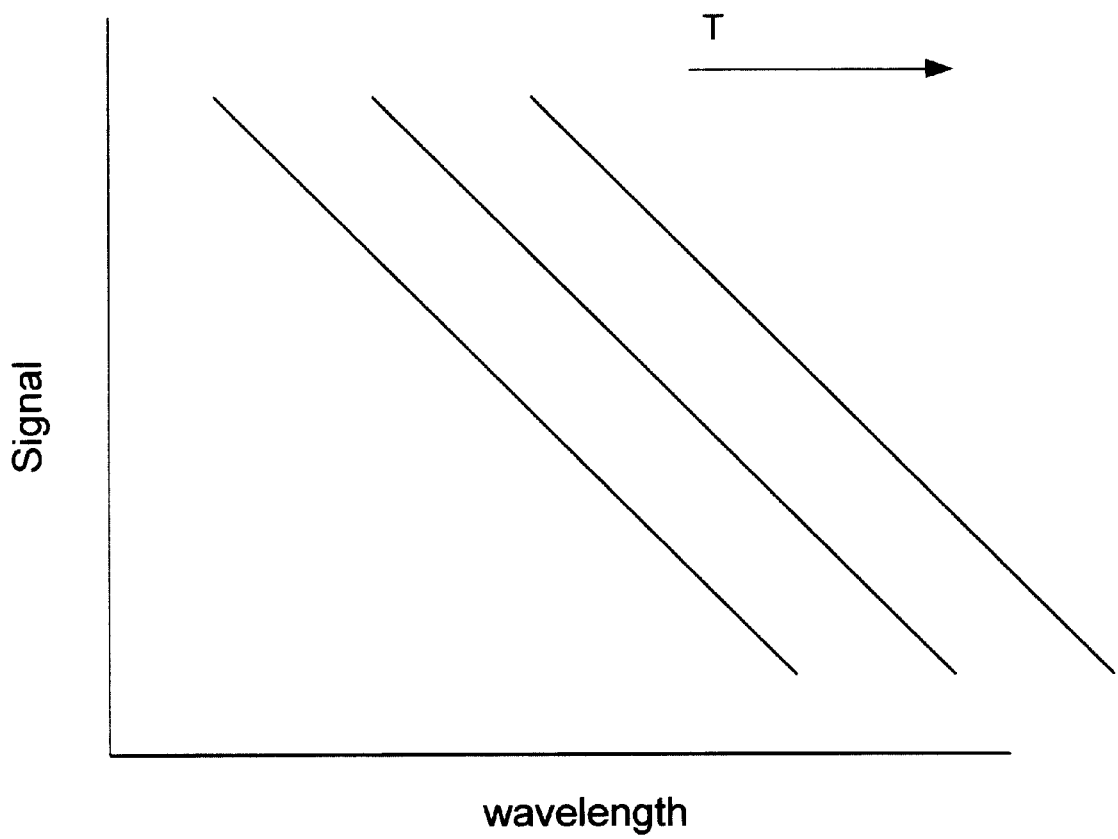
FIG. 20 is a graph illustrating the change in wavelength meter response with temperature.
Figure 21:
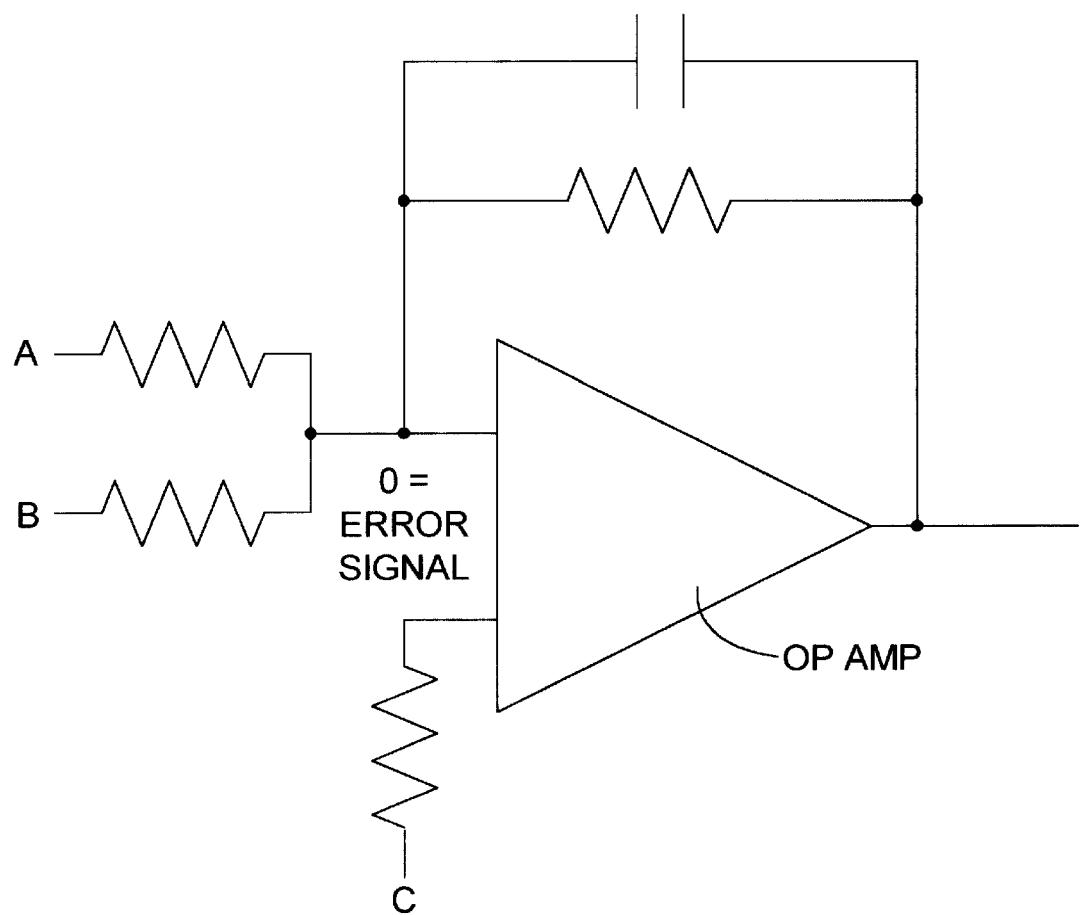
FIG. 21 is a schematic diagram of the generation of an error signal from the FIG. 1 assembly.
Figure 22:
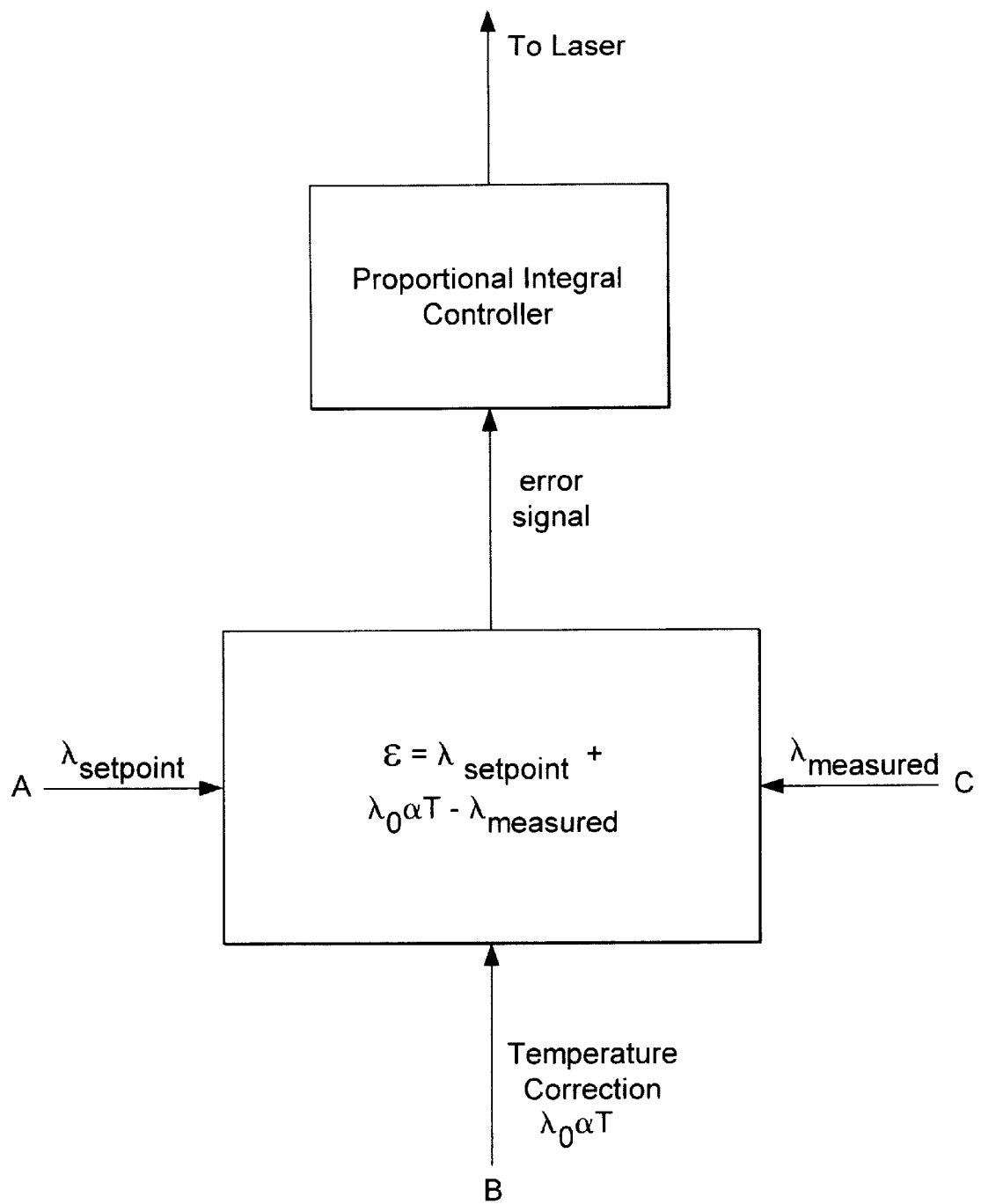
FIG. 22 is a schematic diagram of an embodiment of the FIG. 1 assembly.

Wavelength selective filter 120 is designed so that the desired wavelength is positioned as shown in FIGS. 19(a) and 19(b) with respect to the wavelength selective filter 120 transmission. As illustrated in FIG. 20, the output of the wavelength selective filter 120 is sensitive to temperature. As the temperature changes, the Favbry-Perot wavelength of the etalon shifts which causes a shift in the signal as illustrated in FIG. 20. This shift can be compensated electronically as shown in FIG. 21. The system illustrated in FIG. 21 can be implemented by a circuit of the type illustrated in FIG. 22.

Systems 10 and 110 can be used with the multiplexers and de-multiplexers disclosed in U.S. Pat. Applications, Attorney Docket Nos. 21123-705 and 21123-706, filed on the same date as this application and incorporated herein by reference. Additionally, systems 10 and 110 can be used with the monitoring and control assemblies disclosed in U.S. Pat. Application, Attorney Docket No. 21123-701, filed on the same date as this application, and incorporated herein by reference.

Systems 10 and 110 can be utilized for the wavelengths and metrowave fibers (MWF) disclosed in U.S. Pat. No. 5,905,838, incorporated herein by reference. An illustrative specification table for a suitable metrowave fiber is presented:

MWF Specification Table

Attenuation at 1550 nm
<=0.25 dB/km
Attenuation at 1310 nm
<=0.50 dB/km
Effective area at 1550 nm
>=42 microns
Core eccentricity
Less than or equal to 0.8 microns
Cladding diameter
125+−2.0 microns
Cut-off wavelength
<1250 nm
Zero-dispersion wavelength
1350 nm-1450 nm
Dispersion at 1310 nm
−3.0 to −8 ps/nm-km
Dispersion at 1550 nm
+3.0 to +8 ps/nm-km
Dispersion slope at 1550 nm
0.01–0.05 ps/nm sup 2 -km
Macrobendingloss at 1310 nm
<0.5 dB (1 turn, 32 mm)
Macrobending loss at 1550 nm
<0.05 dB (100 turns, 75 nm)
Coating diameter 245+−10 microns
Proof test 100 kpsi
Reel lengths 2.2, 4.4, 6.4, 8.8, 10.8, 12.6, 19.2 km The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A tunable semiconductor laser system, comprising:
    an edge emitter or VCSEL laser including a semiconductor active region positioned between upper and lower confining regions of opposite type semiconductor material, and first and second reflective members positioned at opposing edges of the active and confining regions, the laser producing an output beam;
    a wavelength tuning member coupled to the laser;
    a temperature sensor coupled to the laser; and
    a control loop coupled to the temperature sensor and the tuning member, wherein in response to a detected change in temperature the control loop sends an adjustment signal to the tuning member and the tuning member adjusts a voltage or current supplied to the laser to provide a controlled frequency and power of an output beam.

2. The laser system of claim 1, wherein the control loop provides a laser output beam wavelength stability that is less than a spacing of a channel of a WDM.

3. The laser system of claim 1, wherein the stabilized output wavelength is in the range 1530 nm to 1565 nm.

4. The laser system of claim 1, wherein the stabilized output wavelength is a set of discrete wavelengths with equal spacing in frequency.

5. The laser system of claim 1, wherein the stabilized output wavelength is in the range 1300 nm to 1625 nm.

6. The laser system of claim 1, wherein the stabilized output wavelength is in a range that is carried by a metrowave fiber.

7. The laser system of claim 1, wherein the stabilized output wavelength is 850 nm.

8. The laser system of claim 1, wherein the control loop provides a laser output beam wavelength stability of at least 0.2 nm.

9. The laser system of claim 1, wherein the temperature sensor is selected from a thermistor, a bi-polar transistor circuit, a diode circuit and a bi-metallic cantilever.

10. The laser system of claim 1, wherein the laser is a tunable VCSEL laser.

11. The laser system of claim 10, wherein in response to a change in temperature the tuning member adjusts a voltage or current applied to the laser to provide the controlled output beam of selected wavelength.

12. The laser system of claim 1, wherein the laser is an edge emitting laser.

13. The laser system of claim 12, wherein in response to a change in temperature the tuning member adjusts a voltage or current to the laser to provide the controlled output beam of selected wavelength.

14. The laser of claim 1, further comprising:
a substrate with a substrate seal ring, the laser being positioned on a surface of the substrate; and
a seal cap including a seal ring, wherein the seal cap seal ring is coupled to the substrate seal ring and form a hermetic seal of the laser in an area defined by the seal cap and the substrate.

15. The laser system of claim 1, wherein the temperature sensor and the laser are positioned on the substrate, and the temperature sensor is positioned in the area defined by the seal cap and the substrate.

16. The laser system of claim 1, wherein the temperature sensor is positioned to measure an ambient temperature adjacent to the laser.

17. The laser system of claim 1, wherein the temperature sensor and the laser form an integral assembly.

18. The laser system of claim 1, wherein the temperature sensor and the laser form a monolithically integrated chip.

19. The laser system of claim 1, wherein the control loop provides wavelength stability over a temperature range of −20° to 85° C.

20. The laser system of claim 1, wherein the control loop provides wavelength stability over a temperature range of 0° to 70° C.

21. The laser system of claim 1, wherein the control loop provides the adjustment signal to the tuning member in response to a difference in a measured temperature and a calibrated temperature of the laser.

22. The laser system of claim 21, wherein the tuning member adjusts the frequency of the laser in response to the adjusted signal from the control loop.

23. The laser system of claim 22, wherein the control loop includes circuitry.

24. The laser system of claim 1, wherein the control loop is an open loop wavelength control system wherein the laser wavelength is tuned in response to changes in temperature.

25. The laser system of claim 1, wherein the control loop is a closed loop wavelength control system in which the laser output wavelength is measured.

26. The laser system of claim 1, wherein the laser includes a cantilever apparatus for tuning the resonance wavelength of the laser.

27. A tunable semiconductor laser system, comprising:
an edge emitter or VCSEL laser including a semiconductor active region positioned between upper and lower confining regions of opposite type semiconductor material, and first and second reflective members positioned at opposing edges of the active and confining regions, the laser producing an output beam;
a wavelength tuning member coupled to the laser;
a wavelength measurement member positioned to receive at least a portion of the output beam of the laser, the wavelength measurement member being coupled to the control loop; and
a control loop coupled to the wavelength measurement and the tuning member, wherein in response to a detected change in wavelength the control loop sends an adjustment signal to the tuning member and the tuning member adjusts a voltage or current supplied to the laser to provide a controlled frequency and power of an output beam.

28. The system of claim 27, further comprising:
a temperature sensor coupled to the laser and the control loop, wherein in response to a detected change in temperature the control loop sends an adjustment signal to the tuning member and the tuning member adjusts a voltage or current supplied to the laser.

29. The laser system of claim 27, wherein the control loop provides a laser output beam wavelength stability that is less than a spacing of a channel of a WDM.

30. A tunable semiconductor laser system, comprising:
laser including,
an electrically responsive substrate;
a support block positioned on the electrically responsive substrate;
a top reflecting member and a bottom reflecting member;
a first cantilever structure including a base section resting on the support block, a deformable section extending above the electrically responsive substrate and creating an air gap between the deformable section and the electrically responsive substrate, and an active head positioned at a predetermined location on the deformable section and including at least a portion of the top reflecting member,
a temperature sensor coupled to the laser; and
a control loop coupled to the temperature sensor and the first cantilever structure, wherein in response to a detected change in temperature the control loop adjusts an electric charge applied to the substrate to provide a controlled frequency and power of an output beam.

31. The laser system of claim 30, wherein the laser further comprises:
a electrical tuning contact disposed on the first cantilever structure for applying a tuning voltage $V_t$ to produce a downward electrostatic force $F_d$ between the electrical tuning contact and the electrically responsive substrate, wherein the size of the air gap is altered and a resonant wavelength is tuned.

32. The laser system of claim 31, wherein the laser further comprises:
an oxidation layer disposed within one of the reflecting members, the oxidation layer having been partially oxidized so that a small aperture of unoxidized remains to provide optical and current confinement.

33. The laser system of claim 30, wherein the control loop provides a laser output beam wavelength stability that is less than a spacing of a channel of a WDM.

34. The laser system of claim 30, wherein the wavelength of the output beam is in a range that is carried by a metrowave fiber.

35. The system of claim 30, wherein the temperature sensor is a second cantilever coupled to the laser substrate.

36. The laser system of claim 30, wherein the temperature sensor is positioned to measure an ambient temperature adjacent to the laser.

37. The laser system of claim 30, wherein the temperature sensor and the laser are positioned on a common substrate.

38. The laser system of claim 30, wherein the temperature sensor and the laser form an integral assembly.

39. The laser system of claim 30, wherein the temperature sensor and the laser form a monolithically integrated chip.

40. A tunable semiconductor laser system, comprising:
a laser including,
an electrically responsive substrate;
a support block positioned on the electrically responsive substrate;
a top reflecting member and a bottom reflecting member;
a first cantilever structure including a base section resting on the support block, a deformable section extending above the electrically responsive substrate and creating an air gap between the deformable section and the electrically responsive substrate, and an active head positioned at a predetermined location on the deformable section and including at least a portion of the top reflecting member;

a wavelength measurement member positioned to receive at least a portion of the output beam of the laser; and a control loop coupled to the a wavelength measurement and the tuning member, wherein in response to a detected change in wavelength the control loop sends an adjustment signal to the tuning member and die tuning member adjusts a voltage or current supplied to the laser to provide a controlled frequency and power of an output beam.

41. The laser system of claim 40, further comprising:

a temperature sensor coupled to the laser and the control loop, wherein in response to a detected change in temperature the control loop sends an adjustment signal to the tuning member and the tuning member adjusts a voltage or current supplied to the laser.

42. A tunable semiconductor laser system, comprising:

a laser including, an electrically responsive substrate;

a support block positioned on the electrically responsive substrate;

a top reflecting member and a bottom reflecting member;

a first cantilever structure including a base section resting on the support block, a deformable section extending above the electrically responsive substrate and creating an air gap between the deformable section and the electrically responsive substrate, and an active head positioned at a predetermined location on the deformable section and including at least a portion of the top reflecting member;

a wavelength measurement member positioned to receive at least a portion of the output beam of the laser; and a control loop coupled to the a wavelength measurement and the tuning member, wherein in response to a detected change in wavelength the control loop sends an adjustment signal to the tuning member and the tuning member adjusts a voltage or current supplied to the laser to provide a controlled output beam of selected wavelength.

* * * * *